(12) United States Patent
Hofmann et al.

(10) Patent No.: US 12,379,666 B2
(45) Date of Patent: Aug. 5, 2025

(54) IDENTIFICATION CODES ON SEMICONDUCTOR CHIPS

(71) Applicant: Infineon Technologies AG, Neubiberg (DE)

(72) Inventors: Detlef Hofmann, Halle (DE); Heiko Aßmann, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 298 days.

(21) Appl. No.: 18/137,131

(22) Filed: Apr. 20, 2023

(65) Prior Publication Data

US 2023/0350309 A1 Nov. 2, 2023

(30) Foreign Application Priority Data

Apr. 29, 2022 (DE) .......... 102022110501.6

(51) Int. Cl.
*G03F 7/00* (2006.01)
*H01L 21/027* (2006.01)
*H01L 21/033* (2006.01)
*H01L 21/311* (2006.01)

(52) U.S. Cl.
CPC ...... *G03F 7/70541* (2013.01); *H01L 21/0275* (2013.01); *H01L 21/0337* (2013.01); *H01L 21/31144* (2013.01)

(58) Field of Classification Search
None
See application file for complete search history.

(56) References Cited

U.S. PATENT DOCUMENTS

| 6,063,685 | A | 5/2000 | Steffan et al. |
| 9,899,332 | B2 | 2/2018 | Butler et al. |
| 10,108,925 | B1 | 10/2018 | Taylor |
| 2016/0172306 | A1* | 6/2016 | Scanlan ............ H01L 23/3114 438/462 |
| 2016/0276238 | A1 | 9/2016 | Lin et al. |
| 2018/0069710 | A1 | 3/2018 | De Langen et al. |

FOREIGN PATENT DOCUMENTS

| DE | 102018209579 A1 | 12/2019 |
| WO | 0154194 A1 | 7/2001 |

* cited by examiner

*Primary Examiner* — Roberts P Culbert
(74) *Attorney, Agent, or Firm* — Murphy, Bilak & Homiller, PLLC

(57) ABSTRACT

A method of generating chip-specific identification code marks on semiconductor chips includes patterning a resist layer over a semiconductor wafer by laser direct image exposure, the patterning including writing chip-specific identification codes into the resist layer over chip areas of the semiconductor wafer. The patterned resist layer is then developed.

9 Claims, 4 Drawing Sheets

IDENTIFICATION CODES ON SEMICONDUCTOR CHIPS

TECHNICAL FIELD

This disclosure relates generally to the technique of semiconductor chips, and in particular to techniques of applying chip-specific identification codes on semiconductor chips.

BACKGROUND

Applying chip-specific identification codes to chips is used for chip tracking, device verification and counterfeit detection at unit level. The cost for applying such chip-specific identification codes can be significant since additional process steps need to be carried out for code application.

SUMMARY

According to an aspect of the disclosure, a method of generating chip-specific identification code marks on semiconductor chips comprises patterning a resist layer over a semiconductor wafer by laser direct image exposure, thereby writing chip-specific identification codes into the resist layer over chip areas of the semiconductor wafer, and developing the patterned resist layer.

According to a further aspect of the disclosure, a semiconductor chip comprises a semiconductor substrate, a permanent resist layer over the semiconductor substrate and a chip-specific identification code mark, wherein the chip-specific identification code mark is formed in the permanent resist layer.

According to still a further aspect of the disclosure, a semiconductor chip comprises a semiconductor substrate, a functional layer over the semiconductor substrate and a chip-specific identification code mark, wherein the chip-specific identification code mark is formed as an etch mark in the functional layer.

BRIEF DESCRIPTION OF THE DRAWINGS

In the drawings, like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

It is to be understood that the features of the various exemplary embodiments and examples described herein may be combined with each other unless specifically noted otherwise.

As used in this specification, the terms "electrically connected" or "electrically coupled" or similar terms are not meant to mean that the elements are directly contacted together; intervening elements may be provided between the "electrically connected" or "electrically coupled" elements, respectively. However, in accordance with the disclosure, the above-mentioned and similar terms may, optionally, also have the specific meaning that the elements are directly contacted together, i.e. that no intervening elements are provided between the "electrically connected" or "electrically coupled" elements, respectively.

Further, the words "over" or "beneath" with regard to a part, element or material layer formed or located or arranged "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located or arranged "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
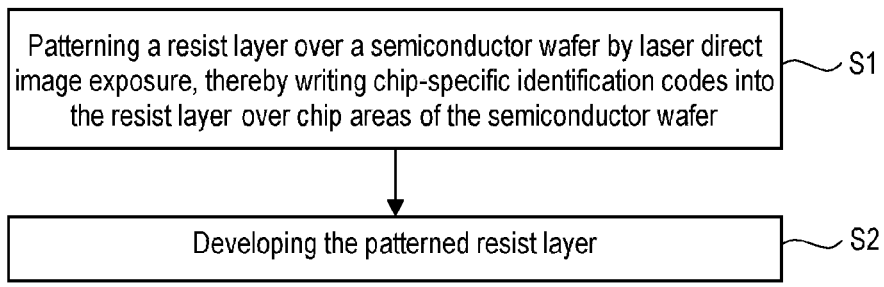
FIG. 1 is a flowchart illustrating stages of an exemplary method of generating a chip-specific identification code mark on a semiconductor chip.

Referring to FIG. 1, a method of generating chip-specific identification code marks on semiconductor chips comprises, at S1, patterning a resist layer over a semiconductor wafer by laser direct image exposure, thereby writing chip-specific identification codes into the resist layer over chip areas of the semiconductor wafer.

At S2 the patterned resist layer is developed. By developing, some of the photoresist is removed by a solution known as "developer" in the art. More specifically, if the resist layer is of a negative tone resist, unexposed regions are removed by the developer, while in case a positive tone resist, exposed regions of the resist layer are removed by the developer.

Laser direct image (LDI) exposure is a process in which the resist is directly patterned by a laser beam. Unlike photo-exposure, LDI does not use a photo-tool (e.g. photomask, reticle, etc.). Rather, an LDI exposure tool is used in which a laser beam is directly writing the pattern (image) into the resist. Typically, an LDI photoresist specially developed for laser direct exposure patterning is used.

The laser beam energy in LDI may be insufficient for laser ablation in semiconductor technology. Rather, the exposure of the resist by the laser beam may cause a chemical change in the resist that renders the exposed portions of the resist either soluble or insoluble in the developer (depending on the tone of the resist).

The chip-specific identification (ID) code can be optically recognizable in the exposed and developed resist layer alone. In many semiconductor chips the resist layer is a permanent layer, i.e. remains as, e.g., a protective layer on the semiconductor chip. In this case, the ID code in the resist layer may be optically recognizable on the later chip product.

However, as will be described in more detail further below, it is also possible to transfer the ID code to an underlying functional layer beneath the patterned resist layer by etching. In this case, the patterned resist layer may or may not be removed. The chip-specific ID code marks on the semiconductor chips are then formed alone or additionally in the etched functional layer. It is to be noted that the transfer is carried out by the etching process rather than by the laser process.

The functional layer beneath the resist layer, which is structured by the etching process, can be a metal layer or an inorganic dielectric layer (such as, e.g., a hard passivation layer of e.g. $SiO_2$ or SiN or a mixture thereof) or a semiconductor layer, e.g. an epitaxial semiconductor layer or a non-epitaxial semiconductor layer deposited on a substrate, or a bulk semiconductor substrate.

Further, as will be described in the following in more detail, the semiconductor chip may, e.g., be a power chip or a MEMS (micro-electro mechanical system) chip or a CMOS (complementary metal-oxide-semiconductor) logic chip.

The unique chip-specific ID codes may comprise a cryptographic key. The cryptographic key may allow authenticating the semiconductor chip and can be used, inter alia, for chip tracking, device verification and/or counterfeit detection.

The unique ID code information assigned to each semiconductor chip may be recorded, e.g., to a data-matrix code, a bar-code, a QR code, etc. It is also possible to use conventional alphabetic characters and/or binary or hex encoding.

Using an LDI exposure tool for applying the unique chip-specific ID code marks on wafer level allows the generation of the ID code marks to occur without an additional process step. That is, this disclosure relates, inter alia, to processes in which the LDI lithography step is performed anyway and for other reasons, and is then additionally used to generate the ID code marks on the semiconductor chips. That means that the generation of the chip-specific ID code marks on the semiconductor chips is carried out, so to speak, "in situ" during lithographic structuring by LDI, which is part of the regular production process. As a result, the chip-specific ID code marks are generated without any additional or subsequent process steps that are typically required to apply ID code marks.

Figure 2:
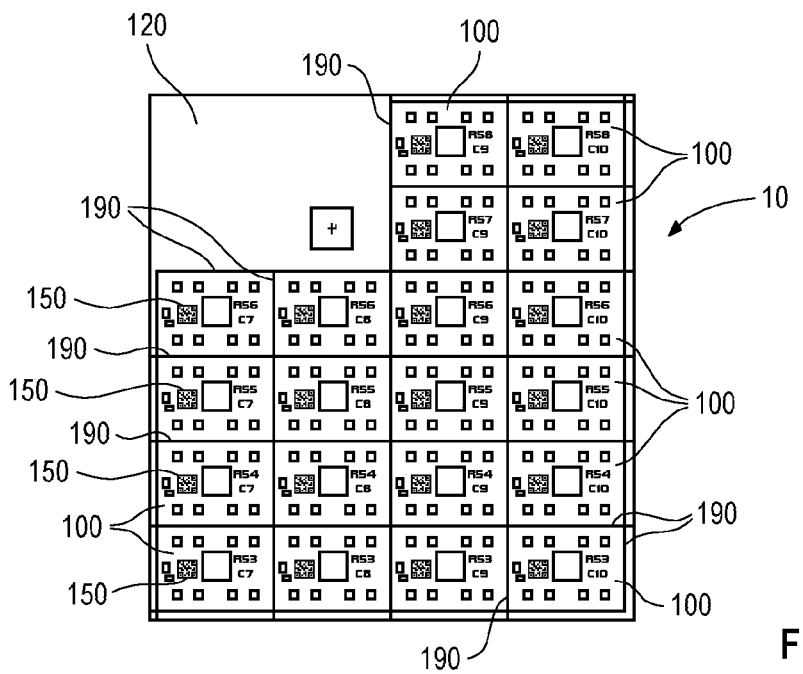
FIG. 2 is a top view of a portion of a semiconductor wafer including a plurality of chip areas and chip-specific identification code marks applied on the chip areas.

FIG. 2 is a top view of a portion of a semiconductor wafer 10. The semiconductor wafer 10 includes a plurality of chip areas 100. The cutting lines (dicing streets) for chip singulation are denoted by reference sign 190.

The semiconductor wafer 10 may be fabricated from any specific semiconductor material(s), for example Si, SiC, SiGe, Ge, GaN, GaAs, InAs, etc., and other compound semiconductors. In particular, the semiconductor wafer 10 may be made of a WBG (Wide Bandgap) semiconductor material such as, e.g., SiC, GaN, and many III-V and II-VI compound semiconductors having a high bandgap.

Figure 3:
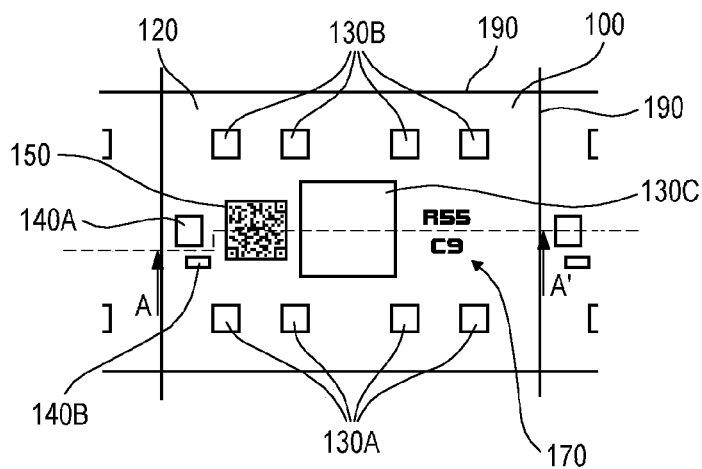
FIG. 3 is an enlarged partial view of FIG. 2 showing one chip area with its chip-specific identification code mark.

Referring also to FIG. 3, the surface of the semiconductor wafer 10 may be formed by a patterned resist layer 120. The resist layer 120 may comprise or be an LDI photoresist. As mentioned before, the resist layer 120 may be of a positive tone resist (where the exposed structures are removed) or a negative tone resist (where the exposed structures remain).

For example, the resist layer 120 is structured for chip pad exposure. For example, load electrode pad(s) and/or control pad(s) on the chip area 100 are exposed. For example, a first row of source pads 130A, a second row of source pads 130B and a large area central source pad 130C are exposed by removed areas of the resist layer 120. Further, the pad layout of the resist layer 120 may include one or more openings for gate pad(s) 140A, 140B. It is to be noted that the pad layout of FIGS. 2 and 3, as provided by the patterned and developed resist layer 120, may be designed in a variety of different shapes.

The resist layer 120 further includes a chip-specific ID code mark 150 over each chip area 100, i.e. within the outline (corresponding to the cutting lines 190) of the chip area 100. For example, the ID code mark 150 may be a classic bar code or a QR code or an industry-established data matrix code. In other examples, the ID code mark 150 may be established by alphabetic characters and/or binary or hex encoding.

The patterned and developed resist layer 120 may further include other information, such as, e.g., information about the wafer or the semiconductor devices integrated in the chip areas 100. Such exemplary information, e.g. in letters and numbers, is indicated by reference sign 170.

Figure 4A:
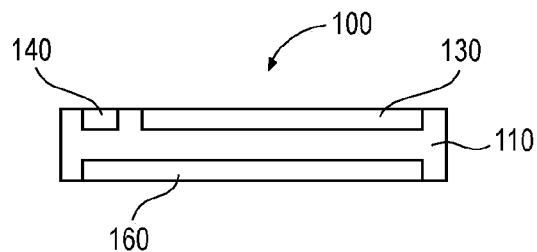
FIG. 4A is a schematic cross-sectional view of an exemplary chip area in a semiconductor wafer after chip pad lithography.
Figure 4B:
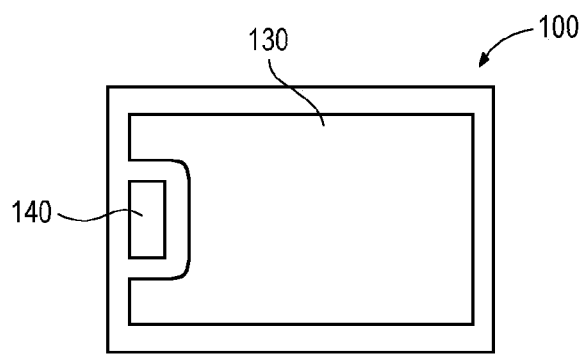
FIG. 4B is a schematic top view of the chip area of FIG. 4A illustrating an exemplary chip pad layout.

FIGS. 4A and 4B illustrate a chip area 100 of the semiconductor wafer 10 after chip pad fabrication. The semiconductor wafer 10, and thus each chip area 100, comprises a semiconductor substrate 110. Reference sign 130 denotes a first load pad electrode and reference sign 140 denotes a control pad electrode of the chip 100. A second load pad electrode 160 may be arranged at a main surface of the chip area (wafer) opposite the main surface at which the first load pad electrode 130 and the control pad electrode 140 are arranged. In the following, without loss of generality, the first load pad electrode is, e.g., a source pad electrode, the control pad electrode 140 is, e.g., a gate pad electrode and the second load pad electrode 160 is, e.g., a drain pad electrode.

The source pad electrode 130 may cover a majority of the upper main surface of the chip area 100. The source pad electrode 130 is also referred to as a source plate in the art.

The source pad electrode 130, the gate pad electrode 140 and/or the drain pad electrode 160 may, e.g., be of any suitable metal used in semiconductor technologies, e.g. of Cu or Al.

As shown in FIGS. 4A and 4B, the chip area 100 may be designed as a vertical device, i.e. a device in which the main current flows in a direction perpendicular to the main surfaces of the chip area 100. However, it is also possible that the chip area 100 is designed as a horizontal device in which all pad electrodes 130, 140, 160 are arranged at the upper main surface of the chip area 100.

As mentioned above, in other examples the first load pad electrode 130 may, e.g., be a drain pad electrode and/or the second load pad electrode 160 may, e.g., be a source pad electrode. Hence, the assignment of the load pad electrodes 130, 160 to source and drain may be exchanged.

Figure 5:
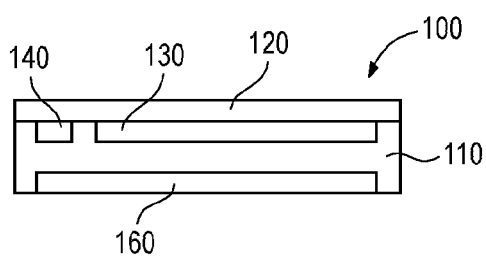
FIG. 5 is a schematic cross-sectional view of the chip area of FIGS. 4A and 4B after deposition of a resist layer on the wafer.

FIG. 5 illustrates the resist layer 120 as applied on the main surface of the chip area 100. Typically, the resist layer 120 covers the entire semiconductor wafer 10 of which only one chip area 100 is shown in FIG. 5.

Figure 6:
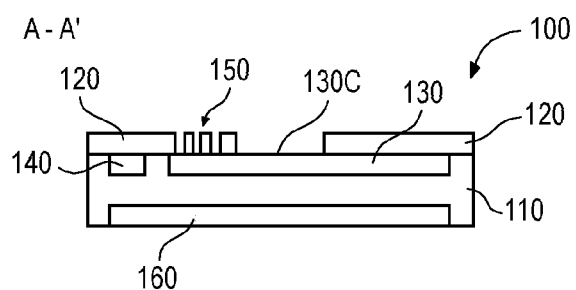
FIG. 6 is a schematic cross-sectional view of the chip area of FIG. 3 along line A-A', after patterning and developing the resist layer of FIG. 5.

FIG. 6, which can be taken as a cross-sectional view along line A-A' of FIG. 3, illustrates the resist layer 120 after patterning and developing. As mentioned before, patterning is carried out by using the LDI technology. In the example shown, LDI serves to define the pad layout of the chip 100, e.g. a distributed source pad layout as exemplified by the row of source pads 130A and 130B, the central source pad 130C, and a distributed gate pad layout as exemplified by the gate pads 140A, 140B. Optionally, further structures such as, e.g., the information 170 can be applied by the LDI technology. In addition, in accordance with the disclosure, LDI is used to generate the chip-specific ID code mark 150. To this end, digital data representing each chip-specific ID code mark is added to the digital data that controls the usual LDI process. No additional semiconductor technology steps need to be carried out for ID mark generation.

After wafer dicing along the cutting lines 190 the individual semiconductor chips (corresponding to the on-wafer chip areas 100) are readily marked. No additional marking at chip or device level is required.

In many cases the resist layer 120 remains as a permanent layer on the semiconductor chips so that the chip-specific ID code marks 150 are recognizable on the later product. In other cases, where the resist layer 120 is removed, the LDI technology may, however, also be used for assigning chip-specific ID code marks 150 to semiconductor chips.

Figure 7:
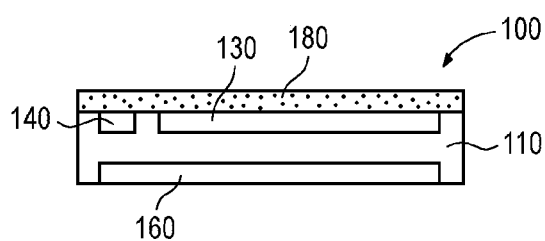
FIG. 7 is a schematic cross-sectional view of the chip area of FIGS. 4A and 4B after deposition of a hard passivation layer on the wafer.

Referring to FIGS. 7 to 10, examples of transferring features defined by patterning the resist layer 120 into a functional layer 180 beneath the patterned resist layer are described. In FIG. 7 the functional layer 180 is, for example and without loss of generality, an inorganic dielectric layer. In other examples the functional layer 180 may, e.g., be a metal layer or a semiconductor layer or may be formed by the bulk semiconductor substrate 110 as such.

Figure 8:
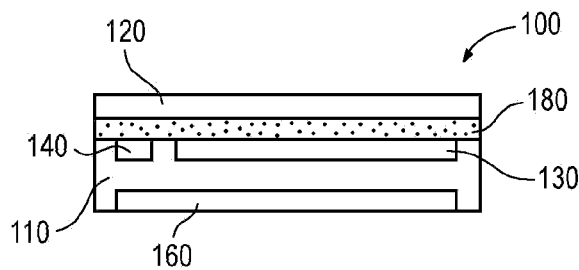
FIG. 8 is a schematic cross-sectional view of the chip area of FIG. 7 after deposition of a resist layer over the hard passivation layer on the wafer.

Referring to FIG. 8, the resist layer 120 is deposited on the functional layer 180. Reference is made to the description of FIG. 5 to avoid reiteration.

Figure 9:
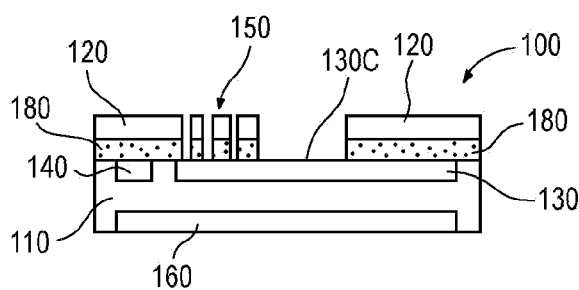
FIG. 9 is a schematic cross-sectional view of the chip area of FIG. 8 after patterning and developing the resist layer of FIG. 8 and after etching of the hard passivation layer.
Figure 10:
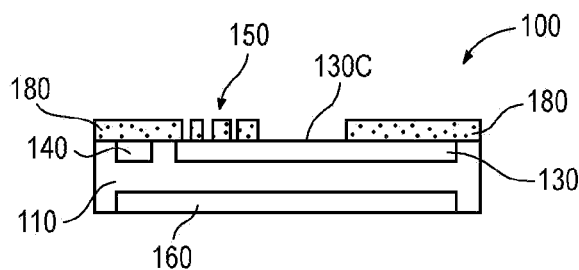
FIG. 10 is a schematic cross-sectional view of the chip area of FIG. 9 after (optional) removing the resist layer.

In FIG. 9 the resist layer 120 is patterned by LDI and developed. Reference is made to the description of FIG. 6 to avoid reiteration.

Further to FIG. 9, an etching process is used to transfer the features defined in the patterned and developed resist layer 120 into the functional layer 180. That way, all structures of the resist layer 120 (compare FIG. 6) may be transferred into the functional layer 180. In particular, this process includes the formation of the chip-specific ID code mark 150 in the functional layer 180. The chip-specific ID code mark 150 in the functional layer 180 is an etch mark, i.e. the walls of the ID code mark 150 are characteristic for material removal by etching.

In one example (FIG. 9), the chip-specific ID code mark 150 may be formed in both layers 120, 180, i.e. in the structured resist layer 120 and the structured functional layer 180. In this case the resist layer 120 remains at least partly on the chip areas 100.

In other examples (FIG. 10), the resist layer 120 may be removed. The chip-specific ID code mark 150 may then be exclusively formed as an etch mark in the underlying functional layer 180.

Generally, the resist layer 120 may be the uppermost layer on the semiconductor wafer 10 or may be applied (and, e.g., removed) at an earlier stage of the wafer processing, followed by subsequent deposition of further layers. Consequently, the underlying functional layer 180 may be, for example, a layer that is exposed on the semiconductor chip (and thus suitable for optical inspection) or a buried layer that is not visually detectable at the surface of the later semiconductor chip. In the latter case, if the underlying functional layer 180 is, e.g., a metal layer, the chip-specific ID code mark 150 may be detected by means other than optical inspection, such as X-ray inspection or IR (infrared) light inspection.

The functional layer 180 may, e.g., be implemented by a layer stack of a plurality of layers (not shown). In this case the chip-specific ID code mark 150 may be formed in such a layer stack.

Figure 11:
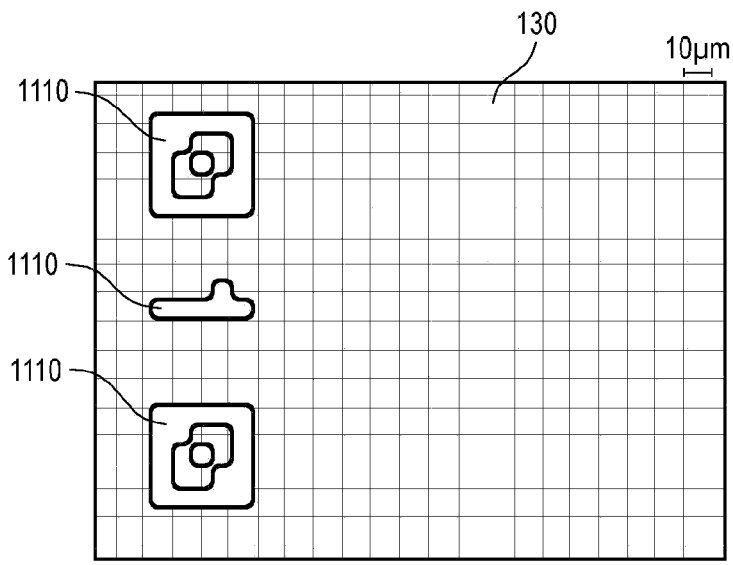
FIG. 11 is a contour-traced optical microscope or SEM (scanning electron microscope) image of a patterned and developed resist layer over a metal pad.

FIG. 11 illustrates a contour-traced optical microscope or SEM image of a patterned and developed resist layer 120 over a metal layer such as, e.g., source pad electrode 130 (with a scale grid of 10 μm pitch added in the figure). FIG. 11 illustrates that a structural width of a few μm, e.g. equal to or greater than 1 μm and/or equal to or less than 5 μm, can be achieved in example resist structures 1110. As known in the art, the minimum structural width achievable by LDI is greater than the minimum structural width of conventional photo-tool lithography.

In the examples described above, the chip-specific ID code mark 150 is applied, e.g., to a power semiconductor chip. In this case, since the chip area 100 of power semiconductor chips typically provides enough space for the ID code mark 150, it is readily possible to apply the ID code mark 150 either in the resist layer 120 and/or in any underlying functional layer 180, e.g., in a dielectric layer or a metal layer.

The power semiconductor chip may include, e.g., a power transistor and/or a power diode. For example, the power transistor chip may be a MOSFET (Metal Oxide Semiconductor Field Effect Transistors) or an IGBT (Insulated Gate Bipolar Transistors) or an HEMT (High Electron Mobility Transistor).

In other examples, the chip-specific ID code mark 150 can be assigned to other semiconductor chips such as, e.g., MEMS chips and/or CMOS logic chips.

Figure 12A:
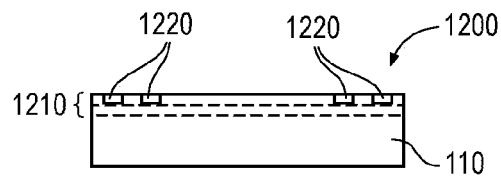
FIG. 12A is a schematic cross-sectional view of a further exemplary chip area in a semiconductor wafer after chip pad lithography.
Figure 12B:
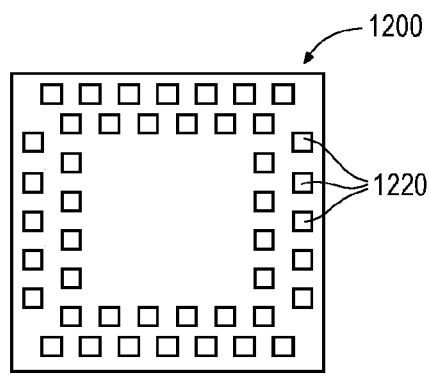
FIG. 12B is a schematic top view of the chip area of FIG. 12A illustrating the chip pad layout.
Figure 13A:
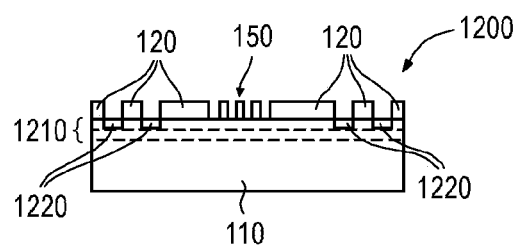
FIG. 13A is a schematic cross-sectional view of the exemplary chip area of FIGS. 12A and 12B in a semiconductor wafer after deposition of a resist layer on the wafer.
Figure 13B:
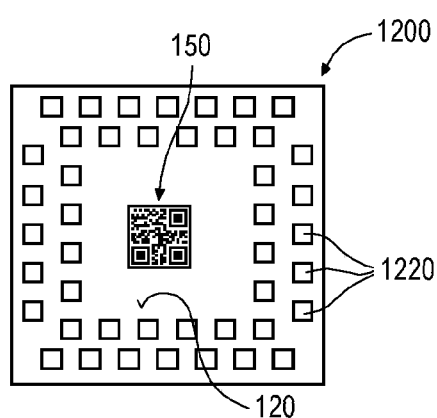
FIG. 13B is a schematic top view of the chip area of FIG. 13A with its chip-specific identification code mark.

FIGS. 12A to 13B illustrate a CMOS logic chip area 1200 in a semiconductor wafer 10 (see FIGS. 2 and 3, the CMOS logic chip area 1200 corresponds to the chip area 100). Referring to FIGS. 12A and 12B, the CMOS logic chip area 1200 may include a metal interconnect 1210 formed by a plurality of metallization layers. The metal interconnect 1210 interconnects the individual devices (transistors, capacitors, resistors, etc.—not shown) in the CMOS logic chip area 1200 and die pads 1220. A large number of die pads 1220 may be exposed at a main surface of the CMOS logic chip area 1200. As shown in FIGS. 13A and 13B, the die pads 1220 may be defined by openings in the resist layer 120 (which may, e.g., be a solder stop layer).

Similar as in the examples described before, the chip-specific ID code mark 150 may be formed in the resist layer 120 during opening the (continuous) resist layer 120 for exposing the die pads 1220. Reference is made to the above description in order to avoid reiteration. Generating the chip-specific ID code mark 150 in the (permanent) resist layer 120 allows to save chip area in comparison to conventional approaches in which a chip-specific ID is formed in the CMOS logic chip during FEOL (frontend of line) processing by, e.g., fuses or other integrated devices.

The following examples pertain to further aspects of the disclosure:

Example 1 is a method of generating chip-specific identification code marks on semiconductor chips, the method comprising: patterning a resist layer over a semiconductor wafer by laser direct image exposure, thereby writing chip-specific identification codes into the resist layer over chip areas of the semiconductor wafer; and developing the patterned resist layer.

In Example 2, the subject matter of Example 1 can optionally include wherein the resist layer is an uppermost resist layer used for chip pad exposure.

In Example 3, the subject matter of Example 1 or 2 can optionally include wherein the resist layer is of a negative tone resist.

In Example 4, the subject matter of Example 1 or 2 can optionally include wherein the resist layer is of a positive tone resist.

In Example 5, the subject matter of any preceding Example can optionally include wherein patterning has a minimum patterning width of equal to or greater than 1 µm.

In Example 6, the subject matter of any preceding Example can optionally include wherein a laser beam energy applied for laser direct image exposure is insufficient for laser ablation in semiconductor technology.

In Example 7, the subject matter of any preceding Example can optionally include wherein the chip-specific identification code mark is optically visible on the chip.

In Example 8, the subject matter of any preceding Example can optionally include wherein the patterned resist layer remains permanently on the wafer, and the chip-specific identification code marks on the semiconductor chips are formed in the developed resist layer.

In Example 9, the subject matter of any Example 1 to 7 can optionally include wherein transferring features defined by patterning the resist layer into a functional layer beneath the patterned resist layer by etching; and removing the patterned resist layer, wherein the chip-specific identification code marks on the semiconductor chips are formed in the etched layer.

In Example 10, the subject matter of any Example 1 to 8 can optionally further include transferring features defined by patterning the resist layer into a functional layer beneath the patterned resist layer by etching.

In Example 11, the subject matter of Example 9 or 10 can optionally include wherein the functional layer is a metal layer.

In Example 12, the subject matter of Example 9 or 10 can optionally include wherein the functional layer is an inorganic dielectric layer.

In Example 13, the subject matter of Example 9 or 10 can optionally include wherein the functional layer is a semiconductor layer.

In Example 14, the subject matter of any preceding Example can optionally include wherein the chip areas are power chip areas or MEMS chip areas.

In Example 15, the subject matter of any Example 1 to 13 can optionally include wherein the chip areas are CMOS logic chip areas.

In Example 16, the subject matter of any preceding Example can optionally include wherein the chip-specific identification codes comprise a cryptographic key for authenticating the semiconductor chip.

Example 17 is a semiconductor chip comprising a semiconductor substrate; a permanent resist layer over the semiconductor substrate; and a chip-specific identification code mark, wherein the chip-specific identification code mark is formed in the permanent resist layer.

In Example 18, the subject matter of Example 17 can optionally include wherein the permanent resist layer is the uppermost resist layer of the semiconductor chip patterned for chip pad layout.

In Example 19, the subject matter of Example 18 can optionally include wherein the chip-specific identification code mark is optically visible on the chip.

Example 20 is a semiconductor chip comprising a semiconductor substrate; a functional layer over the semiconductor substrate; and a chip-specific identification code mark, wherein the chip-specific identification code mark is formed as an etch mark in the functional layer.

In Example 21, the subject matter of Example 20 can optionally include wherein the functional layer is a metal layer or an inorganic dielectric layer or a semiconductor layer.

In Example 22, the subject matter of any Example 17 to 21 can optionally include wherein the chip is a power chip or a MEMS chip or a CMOS logic chip.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of generating chip-specific identification code marks on semiconductor chips, the method comprising:
   patterning a resist layer over a semiconductor wafer by laser direct image exposure, wherein the patterning includes writing chip-specific identification codes into the resist layer over chip areas of the semiconductor wafer and defining a chip pad layout in the resist layer over the chip areas, wherein the resist layer is an uppermost resist layer and remains permanently on the semiconductor wafer; and
   developing the patterned resist layer, wherein the chip-specific identification code marks are formed and the chip pads are exposed in the developed resist layer.

2. The method of claim 1, wherein the resist layer is of a negative tone resist.

3. The method of claim 1, wherein the resist layer is of a positive tone resist.

4. The method of claim 1, wherein the patterning has a minimum patterning width of equal to or greater than 1 µm.

5. The method of claim 1, wherein a laser beam energy applied for the laser direct image exposure is insufficient for laser ablation in semiconductor technology.

6. The method of claim 1, wherein the chip-specific identification code marks are optically visible on the chip.

7. The method of claim 1, wherein the chip areas are power chip areas or MEMS chip areas.

8. The method of claim 1, wherein the chip areas are CMOS logic chip areas.

9. The method of claim 1, wherein the chip-specific identification codes comprise a cryptographic key for authenticating the semiconductor chips.

* * * * *